United States Patent
Tang et al.

(10) Patent No.: US 11,774,507 B2
(45) Date of Patent: Oct. 3, 2023

(54) METHOD AND DEVICE FOR ESTIMATING POWER LIMIT OF BATTERY PACK, AND BATTERY MANAGEMENT SYSTEM

(71) Applicant: CONTEMPORARY AMPEREX TECHNOLOGY CO., LIMITED, Ningde (CN)

(72) Inventors: Shenzhi Tang, Ningde (CN); Guangmei Huang, Ningde (CN); Shichao Li, Ningde (CN); Wei Zhao, Ningde (CN)

(73) Assignee: Kilpatrick Townsend & Stockton LLP, Ningde (CN)

( * ) Notice: Subject to any disclaimer, the term of this patent is extended or adjusted under 35 U.S.C. 154(b) by 144 days.

(21) Appl. No.: 17/562,880

(22) Filed: Dec. 27, 2021

(65) Prior Publication Data
US 2022/0283236 A1 Sep. 8, 2022

Related U.S. Application Data

(63) Continuation of application No. PCT/CN2021/079172, filed on Mar. 4, 2021.

(51) Int. Cl.
  *G01R 31/3835* (2019.01)
  *H02J 7/00* (2006.01)
  *G01R 31/374* (2019.01)

(52) U.S. Cl.
  CPC ....... *G01R 31/3835* (2019.01); *G01R 31/374* (2019.01); *H02J 7/0048* (2020.01); *H02J 7/00306* (2020.01)

(58) Field of Classification Search
  None
  See application file for complete search history.

(56) References Cited

U.S. PATENT DOCUMENTS

2005/0077867 A1* 4/2005 Cawthorne ........... H02J 7/0048
                                                              320/104
2014/0183938 A1    7/2014 Peswani

FOREIGN PATENT DOCUMENTS

CN    104298793       1/2015
CN    104298793 A     1/2015
(Continued)

OTHER PUBLICATIONS

Contemporary Amperex Technology Co., Limited, International Search Report and Written Opinion, PCTCN2021079172, dated Sep. 28, 2021, 11 pgs.
(Continued)

*Primary Examiner* — Jas A Sanghera
(74) *Attorney, Agent, or Firm* — Kilpatrick Townsend & Stockton LLP

(57) ABSTRACT

A method for estimating a power limit of a battery pack is disclosed, including: obtaining an actual minimum cell voltage of an electrical core with a minimum voltage in the battery pack; obtaining a static discharge power limit of the battery pack; calculating, based on the actual minimum cell voltage, an estimated discharge voltage of the electrical core with the minimum voltage for use when the battery pack is discharged based on the static discharge power limit; determining whether the estimated discharge voltage falls between a discharge voltage control threshold of the electrical core with the minimum voltage and an undervoltage threshold of the electrical core with the minimum voltage; and determining a target discharge power limit of the battery pack through a discharge interpolation algorithm when the estimated discharge voltage falls between the discharge voltage control threshold and the undervoltage threshold.

15 Claims, 5 Drawing Sheets

(56) References Cited

FOREIGN PATENT DOCUMENTS

| CN | 104766940 | A | 7/2015 |
|----|-----------|---|--------|
| CN | 106314170 |   | 1/2017 |
| CN | 107102271 | A | 8/2017 |
| CN | 104918821 | B | 2/2018 |
| CN | 108549746 | A | 9/2018 |
| CN | 109709489 | A | 5/2019 |
| CN | 108072844 | B | 4/2020 |
| CN | 112068014 | A | 12/2020 |
| JP | 2004266917 | A | 9/2004 |

OTHER PUBLICATIONS

Guo, Modeling and simulation of N-MH battery power estimation based on Matlab/Simulink, Chinese Journal of Power Source, vol. 42, No. 5, May 31, 2018, ISSN: 1002-087X, 3 pgs.

Contemporary Amperex Technology Co., Limited, Extended European Search Report, EP21777921.4, dated Jun. 1, 2022, 5 pgs.

\* cited by examiner

METHOD AND DEVICE FOR ESTIMATING POWER LIMIT OF BATTERY PACK, AND BATTERY MANAGEMENT SYSTEM

CROSS-REFERENCE TO RELATED APPLICATIONS

This application is a continuation application of PCT Patent Application No. PCT/CN2021/079172, filed with the State Intellectual Property Office of the People's Republic of China on Mar. 4, 2021 and entitled "METHOD AND DEVICE FOR ESTIMATING POWER LIMIT OF BATTERY PACK, AND BATTERY MANAGEMENT SYSTEM", which is incorporated herein by reference in its entirety.

TECHNICAL FIELD

Embodiments of this application relate to the technical field of batteries, and in particular, to a method and device for estimating a power limit of a battery pack, and a battery management system.

BACKGROUND

Estimation of a power limit of a battery is an important function of a battery management system of a powered vehicle. By estimating the power limit of the battery, the powered vehicle can use the battery reasonably to avoid overvoltage and undervoltage, and extend a service life of a battery pack.

It is found that in an existing method for estimating a power limit of a battery pack, the power limit of the battery pack is usually estimated based on a state of charge value of the battery and parameters of an electrical core, which requires switching between a plurality of maps. In a discharge or charge process of the battery pack, if vehicle power cumulatively exceeds a map of a duration longer than a preset time, a power limit needs to be obtained by querying a map of a duration longer than the duration corresponding to the currently used map. The significance of calculation in this method is not definite. If the preset time is relatively short, a margin will be too large; and, if the preset time is relatively long, the limit will be too strict. In addition, the given values jump between the two maps iteratively. Moreover, the battery is prone to undervoltage due to factors such as changed working conditions, precision and errors of the maps, inconsistency of electrical cores, and aging of electrical cores. Therefore, how to control a voltage soundly and avoid undervoltage or overvoltage is an urgent technical issue to be solved.

SUMMARY

In view of the foregoing problems, an embodiment of this application provides a method and device for estimating a power limit of a battery pack, and a battery management system to solve undervoltage or overvoltage problems caused by inaccurate estimation of a power limit in the prior art.

According to an aspect of embodiments of this application, a method for estimating a power limit of a battery pack is provided. The method includes:

obtaining an actual minimum cell voltage of an electrical core with a minimum voltage in the battery pack;

obtaining a static discharge power limit of the battery pack;

calculating, based on the actual minimum cell voltage, an estimated discharge voltage of the electrical core with the minimum voltage for use when the battery pack is discharged based on the static discharge power limit;

determining whether the estimated discharge voltage falls between a discharge voltage control threshold of the electrical core with the minimum voltage and an undervoltage threshold of the electrical core with the minimum voltage, where the discharge voltage control threshold is greater than the undervoltage threshold; and determining a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage.

In an exemplary implementation, the obtaining a static discharge power limit of the battery pack includes: obtaining a minimum state of charge value of electrical cores in the battery pack; obtaining a first temperature of the battery pack; and querying, based on the minimum state of charge value and the first temperature of the battery pack, a preset first correspondence table of a state of charge, a temperature, and a discharge power to obtain the static discharge power limit of the battery pack.

In an exemplary implementation, the calculating, based on the actual minimum cell voltage, an estimated discharge voltage of the electrical core with the minimum voltage for use when the battery pack is discharged based on the static discharge power limit includes:

obtaining the actual minimum cell voltage of the electrical core with the minimum voltage in the battery pack, an actual discharge current of the electrical core with the minimum voltage, and a corresponding discharge-state internal resistance of the electrical core with the minimum voltage;

determining a discharge current limit of the battery pack based on the static discharge power limit; and determining the estimated discharge voltage of the electrical core with the minimum voltage based on the actual minimum cell voltage of the electrical core with the minimum voltage, the actual discharge current of the electrical core with the minimum voltage, the discharge current limit of the battery pack, and the discharge-state internal resistance of the electrical core with the minimum voltage.

In an exemplary implementation, the "determining a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage" includes:

using a difference between the estimated discharge voltage and the undervoltage threshold as an input error term of a proportional-integral-derivative (PID) algorithm to obtain a discharge correction term; correcting the discharge interpolation algorithm based on the discharge correction term; and calculating the target discharge power limit of the battery pack through the corrected discharge interpolation algorithm based on the estimated discharge voltage, the static discharge power limit, the discharge voltage control threshold, the undervoltage threshold, and the minimum power limit of an integrated vehicle.

In an exemplary implementation, the corrected discharge interpolation algorithm is:

$$P_{max} = \frac{(P_{static} - P_{min})}{V_{tg100} - V_{tg0}} \times \Delta V_{corrected} + P_{min},$$

where, $P_{max}$ represents the target discharge power limit of the battery pack; $P_{static}$ represents the static discharge power limit of the battery pack; $P_{min}$ represents the minimum power limit of an integrated vehicle; $V_{tg100}$ is the discharge voltage control threshold of the electrical core with the minimum voltage; $V_{tg0}$ is the undervoltage threshold of the electrical core with the minimum voltage; and $\Delta V_{corrected}$ represents the discharge correction term calculated based on the estimated discharge voltage and the undervoltage threshold.

According to another aspect of embodiments of this application, a method for estimating a power limit of a battery pack is provided. The method includes:

obtaining an actual maximum cell voltage of an electrical core with a maximum voltage in the battery pack;

obtaining a static charge power limit of the battery pack;

calculating, based on the actual maximum cell voltage, an estimated charge voltage of the electrical core with the maximum voltage for use when the battery pack is charged based on the static charge power limit;

determining whether the estimated charge voltage falls between a charge voltage control threshold of the electrical core with the maximum voltage and an overvoltage threshold of the electrical core with the maximum voltage, where the charge voltage control threshold is less than the overvoltage threshold; and determining a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage.

In an exemplary implementation, the obtaining a static charge power limit of the battery pack includes: obtaining a maximum state of charge value of electrical cores in the battery pack and a second temperature of the battery pack; querying, based on the maximum state of charge value and the second temperature of the battery pack, a preset second correspondence table of a state of charge, a temperature, and a charge power to obtain the static charge power limit.

In an exemplary implementation, the calculating, based on the actual maximum cell voltage, an estimated charge voltage of the electrical core with the maximum voltage for use when the battery pack is charged based on the static charge power limit includes: obtaining the actual maximum cell voltage of electrical cores in the battery pack, an actual charge current of the electrical core with the maximum voltage, and a corresponding charge-state internal resistance of the electrical core with the maximum voltage; determining a charge current limit of the battery pack based on the static charge power limit of the battery pack; and determining the estimated charge voltage based on the actual maximum cell voltage, the actual charge current, the charge current limit, and the charge-state internal resistance.

In an exemplary implementation, the "determining a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage" includes: using a difference between the estimated charge voltage and the overvoltage threshold of the electrical core with the maximum voltage as an input error term of a PID algorithm to obtain a charge correction term; correcting the charge interpolation algorithm based on the charge correction term; and calculating the target charge power limit of the battery pack through the corrected charge interpolation algorithm based on the estimated charge voltage, the static charge power limit, the charge voltage control threshold, the overvoltage threshold, and the minimum power limit of an integrated vehicle.

In an exemplary implementation, the corrected charge interpolation algorithm is:

$$P'_{max} = \frac{(P'_{static} - P'_{min})}{V'_{tg100} - V'_{tg0}} \times \Delta V'_{corrected} + P'_{min},$$

where, $P'_{max}$ represents the target charge power limit of the battery pack; $P'_{static}$ represents the static charge power limit of the battery pack; $P'_{min}$ represents the minimum power limit of an integrated vehicle; $V'_{tg100}$ is the charge voltage control threshold of the electrical core with the maximum voltage; $V'_{tg0}$ is the overvoltage threshold of the electrical core with the maximum voltage; and $\Delta V'_{corrected}$ represents the charge correction term calculated based on the estimated charge voltage and the overvoltage threshold.

According to another aspect of embodiments of this application, a device for estimating a power limit of a battery pack is provided. The device includes:

a first obtaining module, configured to obtain an actual minimum cell voltage of an electrical core with a minimum voltage in the battery pack;

a second obtaining module, configured to obtain a static discharge power limit of the battery pack;

a first calculation module, configured to calculate, based on the actual minimum cell voltage, an estimated discharge voltage of the electrical core with the minimum voltage for use when the battery pack is discharged based on the static discharge power limit;

a first determining module, configured to determine whether the estimated discharge voltage falls between a discharge voltage control threshold of the electrical core with the minimum voltage and an undervoltage threshold of the electrical core with the minimum voltage, where the discharge voltage control threshold is greater than the undervoltage threshold; and a second determining module, configured to determine a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage.

According to another aspect of embodiments of this application, a device for estimating a power limit of a battery pack is provided. The device includes:

a third obtaining module, configured to obtain an actual maximum cell voltage of an electrical core with a maximum voltage in the battery pack;

a fourth obtaining module, configured to obtain a static charge power limit of the battery pack;

a second calculation module, configured to calculate, based on the actual maximum cell voltage, an estimated charge voltage of the electrical core with the maximum voltage for use when the battery pack is charged based on the static charge power limit;

a third determining module, configured to determine whether the estimated charge voltage falls between a charge voltage control threshold of the electrical core with the maximum voltage and an overvoltage threshold of the electrical core with the maximum voltage, where the charge voltage control threshold is less than the overvoltage threshold; and a fourth determining module, configured to determine a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage.

According to another aspect of embodiments of this application, a battery management system is provided, including a processor, a memory, a communications interface, and a communications bus. The processor, the memory, and the communications interface communicate with each other through the communications bus. The memory is configured to store at least one executable instruction. The executable instruction causes the processor to perform operations of the foregoing method for estimating a power limit of a battery pack.

According to another aspect of embodiments of this application, a powered vehicle is provided. The powered vehicle includes the foregoing battery management system.

According to still another aspect of embodiments of this application, a computer-readable storage medium is provided. The computer-readable storage medium stores at least one executable instruction. When being executed on a device for estimating a power limit of a battery pack, the executable instruction causes the device for estimating a power limit of a battery pack to perform operations of the foregoing method for estimating a power limit of a battery pack.

In the embodiments of this application, the estimated voltage is calculated. The estimated voltage is closer to a voltage range available to an electrical core in the battery pack at a next moment, so that the estimation of the power limit is more accurate. In addition, in the embodiments of this application, when the estimated voltage falls within a preset threshold range, the power limit within the preset threshold range is calculated through an interpolation algorithm. This can adapt to the power limit control under complicated working conditions, and the power limit can be estimated accurately and reasonably, so that the power change is smooth in a process of controlling the vehicle.

The foregoing description is merely an overview of the technical solutions of the embodiments of this application. The following expounds specific embodiments of this application to enable a clearer understanding of the technical means of the embodiments of this application, enable implementation based on the content of the specification, and make the foregoing and other objectives, features, and advantages of the embodiments of this application more evident and comprehensible.

BRIEF DESCRIPTION OF DRAWINGS

The drawings are merely intended to show the embodiments, but not intended to limit this application. In all the drawings, the same reference numeral represents the same component. In the drawings.

DETAILED DESCRIPTION OF EMBODIMENTS

Figure 1:
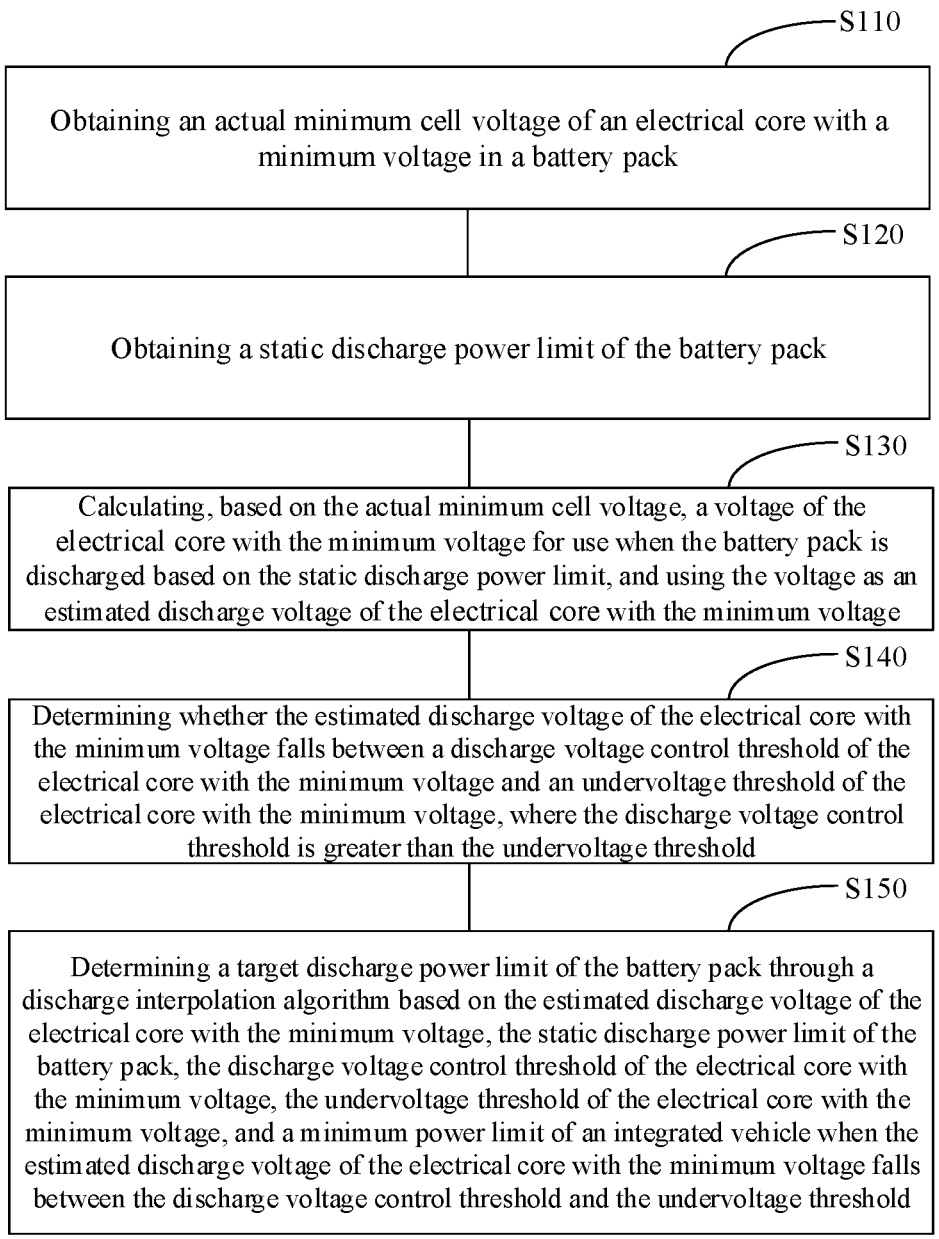
FIG. 1 shows a schematic flowchart of a method for estimating a power limit of a battery pack according to an embodiment of this application.

The following describes exemplary embodiments of this application in more detail with reference to the drawings. Understandably, although the exemplary embodiments of this application are shown in the drawings, this application may be implemented in various forms, and is not limited to the embodiments expounded herein.

FIG. 1 shows a flowchart of a method for estimating a power limit of a battery pack according to an embodiment of this application. The method is performed by a battery management system. The battery management system may be a battery management system in a powered vehicle. As shown in FIG. 1, this method is used to control a discharge power during operation of a vehicle, for example, control the discharge power when the vehicle starts moving or accelerates. The method includes the following steps.

S110: Obtaining an actual minimum cell voltage of an electrical core with a minimum voltage in a battery pack.

The electrical core with the minimum voltage in the battery pack means an electrical core with the lowest voltage in the battery pack. The actual minimum cell voltage of the electrical core with the minimum voltage in the battery pack is a voltage value corresponding to an electrical core with the lowest actual voltage in the battery pack. The actual minimum cell voltage is obtained by a battery management system by measuring in real time.

S120: Obtaining a static discharge power limit of the battery pack.

In this embodiment of this application, the static discharge power limit of the battery pack is obtained based on a correspondence between a temperature of the battery pack, a state of charge value (hereinafter referred to as "SOC", ranging from 0 to 100), and a discharge power limit. Specifically, a minimum state of charge value of electrical cores in the battery pack, which is obtained by the battery management system, may be used as the SOC of the battery pack; and a first temperature of the battery pack is obtained. Based on the minimum state of charge value and the first temperature of the battery pack, a preset first correspondence table of a SOC, a temperature, and a discharge power is queried to obtain the static discharge power limit of the battery pack. The first temperature is a temperature of the battery pack at a current moment.

S130: Calculating, based on the actual minimum cell voltage, an estimated discharge voltage of the electrical core with the minimum voltage for use when the battery pack is discharged based on the static discharge power limit.

The method for estimating a power limit of a battery pack according to this embodiment of this application is applicable to power control during operation of a vehicle. Therefore, the discharge power limit for a next time period needs to be determined based on a voltage state of the electrical core with the minimum voltage in the battery pack. The discharge voltage of an electrical core is a voltage exhibited when the electrical core in the battery pack is discharged at a discharge current. Due to characteristics of a battery, if the electrical core is discharged at a pulse current at a next moment, this part of electrical core discharge voltage (ohmic voltage drop) included in the electrical core voltage drops immediately in a short time. Therefore, this part of voltage drop is not suitable for use as a basis for calculating an allowable pulse value (target discharge power limit) subsequently. If the discharge power limit is calculated directly by using the actual minimum cell voltage as an input term, the calculated discharge power limit is greater than a real discharge power limit. Consequently, undervoltage is likely to occur. Therefore, the voltage of the electrical core with the minimum voltage in the battery pack needs to be estimated to determine an estimated discharge voltage of the electrical core with the minimum voltage. The estimation process specifically includes the following steps.

S1301: Obtaining the actual minimum cell voltage of the electrical core with the minimum voltage in the battery pack, an actual discharge current of the electrical core with the minimum voltage, and a corresponding discharge-state internal resistance of the electrical core with the minimum voltage. Because the electrical cores in the battery pack are serial-connected to form the battery pack, the actual discharge current of the electrical core with the minimum voltage is an actual current of the battery pack, and can be measured by the battery management system. The actual discharge current is positive during discharging. The discharge-state internal resistance of the electrical core with the minimum voltage may be obtained by querying a preset correspondence table of a state of charge, a temperature, and a state internal resistance based on the minimum state of charge value and the first temperature of the battery pack. A time corresponding to the discharge-state internal resistance of the electrical core with the minimum voltage may be a preset time length such as 2 s and 5 s.

S1302: Determining a discharge current limit of the battery pack based on the static discharge power limit of the battery pack. The discharge current limit of the battery pack corresponds to the static discharge power limit of the battery pack. The discharge current limit of the battery pack may be determined based on the correspondence. The discharge current limit of the battery pack may be calculated based on a power formula, or may be obtained by querying a preset relationship table.

In this embodiment of this application, the discharge current limit of the battery pack may be calculated based on the following power formula:

$$P_{static}=I_{total\ threshold} \times U_{actual}$$

where, $P_{static}$ is the static discharge power limit of the battery pack; $I_{total\ threshold}$ is the discharge current limit of the battery pack; and $U_{actual}$ is an actual voltage of the battery pack, and may be calculated based on a preset relationship or may be determined by querying a preset relationship table of the static discharge power limit, the discharge current limit, and the voltage. The electrical cores in the battery pack are serial-connected with each other. Therefore, the actual voltage of the battery pack is a sum of actual voltages of all the electrical cores; and the discharge current limit of the battery pack is the same as the discharge current limit of the electrical cores.

S1303: Determining the estimated discharge voltage of the electrical core with the minimum voltage based on the actual minimum cell voltage of the electrical core with the minimum voltage, the actual discharge current of the electrical core with the minimum voltage, the discharge current limit of the electrical core with the minimum voltage, and the discharge-state internal resistance of the electrical core with the minimum voltage. In this embodiment of this application, the estimated discharge voltage is determined by using the following formula:

$$V_{estimated}=V_{actual}+(I_{actual}-I_{threshold}) \times DCR$$

where, $V_{estimated}$ is the estimated discharge voltage of the electrical core with the minimum voltage; $V_{actual}$ is the actual minimum cell voltage of the electrical core with the minimum voltage; $I_{actual}$ is the actual discharge current of the electrical core with the minimum voltage; $I_{threshold}$ is the discharge current limit of the electrical core with the minimum voltage; and DCR is the discharge-state internal resistance of the electrical core with the minimum voltage.

In this embodiment of this application, for an acceleration scenario during operation of the vehicle, the battery pack keeps being in a discharge state, and the estimated voltage of the battery pack may be determined by using the foregoing formula. In a scenario of starting movement of the vehicle, the actual minimum cell voltage is a cell open circuit voltage (OCV) of the electrical core with the minimum voltage in the battery pack. The actual minimum cell voltage may be obtained by querying a correspondence table of the state of charge, the temperature, and the open circuit voltage. When the vehicle just starts moving, no actual discharge current is generated, so that $I_{actual}$ is 0. Therefore, the formula for calculating the estimated discharge voltage of the electrical core with the minimum voltage is transformed into:

$$V_{estimated}=OCV+I_{threshold} \times DCR$$

where, OCV is the cell open circuit voltage of the electrical core with the minimum voltage in the battery pack, $I_{threshold}$ is the discharge current limit of the battery pack, and DCR is the discharge-state internal resistance of the electrical core with the minimum voltage in the battery pack.

The estimated voltage of the electrical core with the minimum voltage is calculated in the way described above, so that the estimated voltage is closer to a voltage range available to the electrical core with the minimum voltage in the battery pack at a next moment. In this way, the subsequent calculation of the discharge power limit of the battery pack is more accurate and reasonable.

S140: Determining whether the estimated discharge voltage of the electrical core with the minimum voltage falls between a discharge voltage control threshold of the electrical core with the minimum voltage and an undervoltage threshold of the electrical core with the minimum voltage, where the discharge voltage control threshold is greater than the undervoltage threshold.

In this embodiment of this application, a discharge voltage control threshold of the electrical core with the minimum voltage is set. To be specific, the discharge power limit is calculated when the estimated discharge voltage is less than the discharge voltage control threshold and greater than the undervoltage threshold.

This makes undervoltage less likely to occur when the cell voltage of the electrical core with the minimum voltage in the battery pack is relatively high. When the cell voltage of the electrical core with the minimum voltage in the battery pack decreases, the probability of undervoltage increases. Therefore, when the cell voltage of the electrical core with the minimum voltage in the battery pack is relatively high, the target discharge power limit may be determined by existing means of table query or by other means. When the cell voltage of the electrical core with the minimum voltage in the battery pack decreases to a value that is less than or equal to the discharge voltage control threshold of the electrical core with the minimum voltage, the target discharge power limit of the battery pack is determined by using the method for estimating a power limit of a battery pack according to this embodiment of this application, so that the determined discharge power limit is more reasonable and accurate. Therefore, in this embodiment of this application, the discharge voltage control threshold is set as a trigger condition of control. The value of the discharge voltage control threshold is not specifically limited in this embodiment of this application, and may be set by a person skilled in the art based on a specific application scenario and parameters of the battery pack. In an embodiment of this application, the discharge voltage control threshold may be a static cell open circuit voltage of the electrical core with the minimum voltage at a 0SOC (that is, when the state of charge value is 0). Specifically, the static cell open circuit voltage at a 0SOC may be determined based on the temperature of the electrical core with the minimum voltage. If the cell open circuit voltage of the electrical core with the minimum voltage at a 0SOC is 3.3 V, the discharge voltage control threshold is 3.3 V, which is about 200 mV higher than the real undervoltage threshold of the electrical core with the minimum voltage.

The undervoltage threshold in this embodiment of this application may be the real undervoltage threshold of the electrical core with the minimum voltage in the battery pack, or may be slightly higher than the real undervoltage threshold.

S150: Determining a target discharge power limit of the battery pack through a discharge interpolation algorithm based on the estimated discharge voltage of the electrical core with the minimum voltage, the static discharge power limit of the battery pack, the discharge voltage control threshold of the electrical core with the minimum voltage, the undervoltage threshold of the electrical core with the minimum voltage, and a minimum power limit of an integrated vehicle when the estimated discharge voltage of the electrical core with the minimum voltage falls between the discharge voltage control threshold and the undervoltage threshold.

All the electrical cores in the battery pack are serial-connected, and the discharge current of the electrical cores in the battery pack depends on the voltage of the electrical core with the minimum voltage. Therefore, the target discharge power limit of the battery pack is limited by the electrical core with the minimum voltage. Therefore, based on a proportional relationship between the estimated voltage, the undervoltage threshold, and the discharge voltage control threshold of the electrical core with the minimum voltage, a proportional relationship between the target discharge power limit, the static discharge power limit, and the minimum power limit of an integrated vehicle can be determined, and the target discharge power limit is thereby determined.

In this embodiment of this application, the target discharge power limit of the battery pack may be determined by using the following discharge interpolation algorithm:

$$P_{max} = \frac{(P_{static} - P_{min})}{V_{tg100} - V_{tg0}} \times (V_{estimated} - V_{tg0}) + P_{min}.$$

The discharge interpolation algorithm is a linear interpolation algorithm. where, $P_{max}$ represents the target discharge power limit of the battery pack; $P_{static}$ represents the static discharge power limit of the battery pack; $P_{min}$ represents the minimum power limit of an integrated vehicle; $V_{tg100}$ is the discharge voltage control threshold of the electrical core with the minimum voltage; $V_{tg0}$ is the undervoltage threshold of the electrical core with the minimum voltage; and V estimated represents the estimated discharge voltage of the electrical core with the minimum voltage.

In another embodiment of this application, the "determining a target discharge power limit of the battery pack through a discharge interpolation algorithm based on the estimated discharge voltage of the electrical core with the minimum voltage, the static discharge power limit of the battery pack, the discharge voltage control threshold of the electrical core with the minimum voltage, the undervoltage threshold of the electrical core with the minimum voltage, and a minimum power limit of an integrated vehicle" includes the following steps.

S1501: Using a difference between the estimated discharge voltage of the electrical core with the minimum voltage and the undervoltage threshold of the electrical core with the minimum voltage as an input error term of a proportional-integral-derivative (PID) algorithm to obtain a discharge correction term.

The discharge correction term is determined by using the following formula:

$$\Delta V_{corrected} = k_p \times (V_{estimated} - V_{tg0}) + k_i \times \text{integral term of } (V_{estimated} - V_{tg0}) + k_d \times \text{variation of } (V_{estimated} - V_{tg0})$$

The PID algorithm works in the following way: in process control, the PID algorithm continuously calculates an error value and applies a correction based on proportional (P), integral (I), and derivative (D) terms, so that a measured process variable is input, and a control variable is output. The output control variable exerts an influence on the input process variable, so that the process variable can be close to a target value. Generally, an object under control is inertial rather than instantaneous. PID includes three terms: a proportional term ($k_p \times$ error), an integral term ($k_i \times$ a sum of errors over a past period), and a derivative term ($k_d \times$ a rate of error change). The error means a difference between the measured process variable and the target value. In this embodiment of this application, the discharge correction term is calculated based on the estimated discharge voltage and the undervoltage threshold, and is a correction term for correcting ($V_{estimated}-V_{tg0}$) in the interpolation formula.

S1502: Correcting the discharge interpolation algorithm based on the discharge correction term.

In this embodiment of this application, the discharge interpolation algorithm is corrected based on the discharge correction term, and the corrected interpolation algorithm is:

$$P_{max} = \frac{(P_{static} - P_{min})}{V_{tg100} - V_{tg0}} \times \Delta V_{corrected} + P_{min}$$

where, with respect to the variables $k_p$, $k_i$, and $k_d$ in $\Delta V_{corrected}$, $k_p$ is not 0, and $k_i$ and $k_d$ may be 0. To be specific, depending on the specific scenario, $k_p$ alone may be selected as the variable, or $k_p$, $k_i$, and $k_d$ are all selected as variables. When $k_p$ is 1, and $k_i$ and $k_d$ are both 0, the interpolation algorithm is not corrected. In this embodiment of this application, specific values of $k_p$, $k_i$, and $k_d$ may be obtained by calibrating and training based on the specific scenario. For example, based on a correspondence between the estimated discharge voltage of the electrical core with the minimum voltage and a target power limit of the battery pack in a preset scenario, the specific values may be obtained by calibrating based on the corrected interpolation algorithm.

S1503: Calculating a target discharge power limit of the battery pack through the corrected discharge interpolation algorithm based on the estimated discharge voltage of the electrical core with the minimum voltage, the static discharge power limit of the battery pack, the discharge voltage control threshold of the electrical core with the minimum voltage, the undervoltage threshold of the electrical core with the minimum voltage, and a minimum power limit of an integrated vehicle.

In this embodiment of this application, the interpolation algorithm is corrected, so that the calculated target discharge power limit of the battery pack is more accurate and reasonable, and the voltage can be controlled soundly to avoid undervoltage.

In this embodiment of this application, after the target discharge power limit is obtained, the method further includes the following steps.

S160: Outputting the target discharge power limit to a controller of a vehicle to control the discharge power during operation of the vehicle.

The controller of the vehicle may be a vehicle control unit (VCU) or an electronic control unit (ECU). Based on the target discharge power limit, the controller of the vehicle controls the discharge power when the vehicle starts moving or accelerates, so that the voltage can be well controlled in the control process to avoid undervoltage. In addition, the discharge power changes smoothly or even remains steady, so that the vehicle can starts moving or accelerates steadily even under harsh working conditions.

In the method for estimating a power limit of a battery pack according to this embodiment of this application, the estimated discharge voltage of the electrical core with the minimum voltage in the battery pack is calculated. The estimated discharge voltage is closer to a voltage range available to the electrical core with the minimum voltage in the battery pack at a next moment, so that the estimation of the target discharge power limit is more accurate. In addition, in this embodiment of this application, when the estimated discharge voltage falls within a preset threshold range, the target power limit within the preset threshold range is calculated through an interpolation algorithm. Therefore, the power limit can be estimated accurately and reasonably, the vehicle can control the voltage soundly to avoid undervoltage even under harsh working conditions, and the change of the discharge power is smooth in a process of controlling the vehicle.

Figure 2:
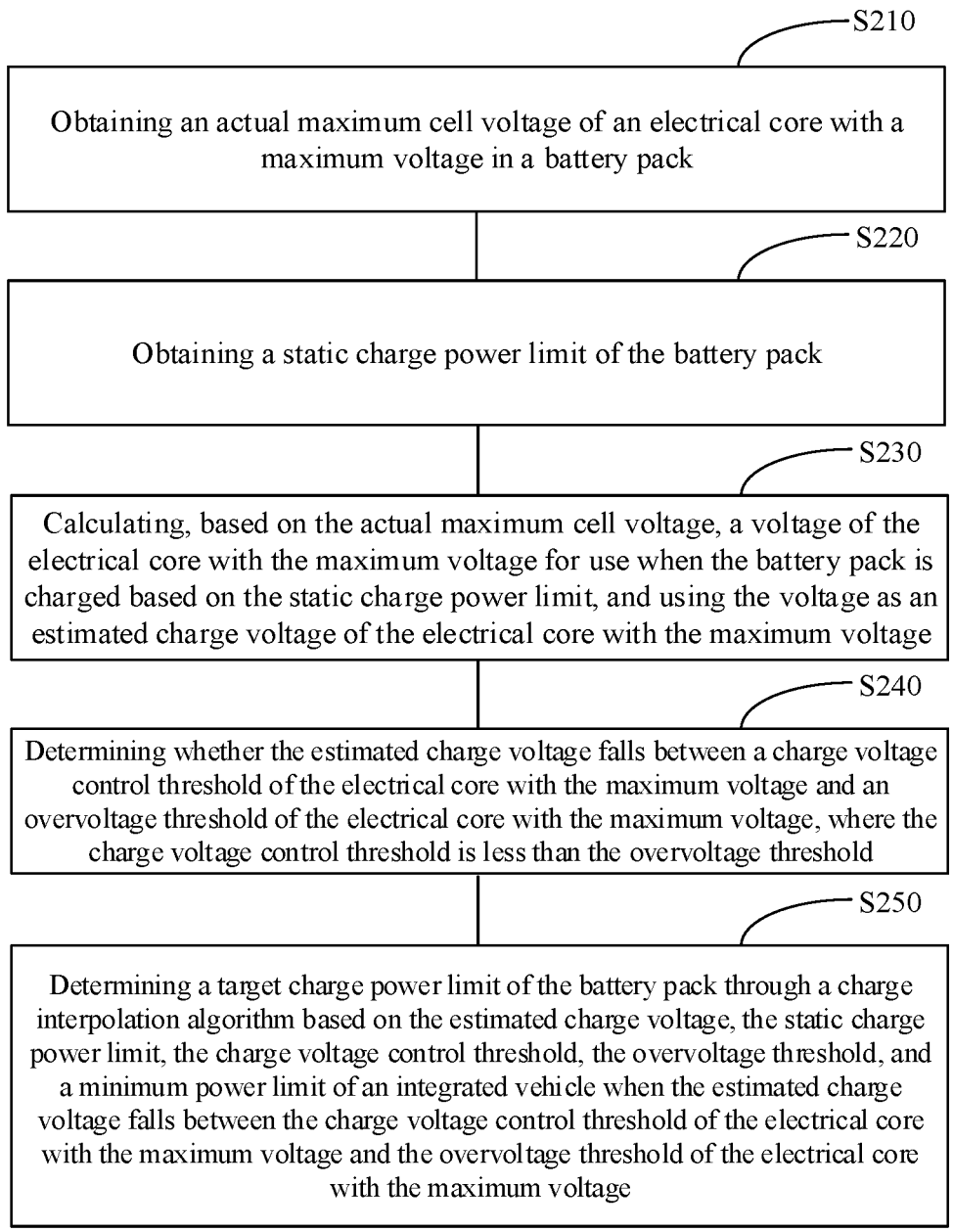
FIG. 2 shows a schematic flowchart of a method for estimating a power limit of a battery pack according to another embodiment of this application.

FIG. 2 shows a flowchart of a method for estimating a power limit of a battery pack according to another embodiment of this application. The method is performed by a battery management system. The battery management system may be a battery management system in a powered vehicle. As shown in FIG. 2, this method is used to control a charge power during operation of a vehicle, for example, control the charge power during regenerative braking. The method includes the following steps.

S210: Obtaining an actual minimum cell voltage of an electrical core with a minimum voltage in a battery pack.

The electrical core with the maximum voltage in the battery pack means an electrical core with the highest voltage in the battery pack. The actual maximum cell voltage of electrical cores in the battery pack is a voltage value corresponding to an electrical core with the highest actual voltage in the battery pack. The actual maximum cell voltage is obtained by a battery management system by measuring in real time.

S220: Obtaining a static charge power limit of the battery pack.

In this embodiment of this application, the static charge power limit of the battery pack is obtained based on a correspondence between a temperature of the battery pack, a state of charge value (hereinafter referred to as "SOC"), and a charge power limit. Specifically, a maximum state of charge value of electrical cores in the battery pack, which is obtained by the battery management system, may be used as the SOC of the battery pack; and a second temperature of the battery pack is obtained. Based on the state of charge value and the second temperature of the battery pack, a preset second correspondence table of a SOC, a temperature, and a charge power is queried to obtain the static charge power limit of the battery pack. The second temperature is a temperature of the battery pack at a current moment.

S230: Calculating, based on the actual maximum cell voltage, an estimated charge voltage of the electrical core with the maximum voltage for use when the battery pack is charged based on the static charge power limit.

The method for estimating a power limit of a battery pack according to this embodiment of this application is applicable to power control during operation of a vehicle. Therefore, the target charge power limit for a next time period needs to be determined based on a voltage state of the battery pack. The charge voltage of an electrical core is a voltage exhibited when the electrical core in the battery pack is charged at a charge current. Due to characteristics of a battery, if the cell is charged at a pulse current at a next moment, this part of electrical core charge voltage (ohmic voltage drop) included in the electrical core voltage increases immediately in a short time. Therefore, this part of voltage drop is not suitable for use as a basis for calculating an allowable pulse value (target charge power limit) subsequently. If the target charge power limit is calculated directly by using the actual maximum cell voltage as an input term, the calculated target charge power limit is greater than a real charge power limit. Consequently, overvoltage of the battery pack is likely to occur and lead to overvoltage. Therefore, the voltage state of the battery pack needs to be estimated. The estimation process specifically includes the following steps.

S2301: Obtaining the actual maximum cell voltage of the electrical core with the maximum voltage in the battery pack, an actual charge current of the electrical core with the maximum voltage, and a corresponding charge-state internal resistance of the electrical core with the maximum voltage. The actual charge current of the electrical core with maximum voltage is an actual charge current of the battery pack, and can be measured by the battery management system. The actual charge current is negative during charging. The charge-state internal resistance of the electrical core with the maximum voltage may be obtained by querying a preset correspondence table of a state of charge, a temperature, and a state internal resistance based on the maximum state of charge value of the electrical core with the maximum voltage in the battery pack and the second temperature of the battery pack. A time corresponding to the charge-state internal resistance may be a preset time length such as 2 s and 5 s.

S2302: Determining a charge current limit based on the static charge power limit of the battery pack. The charge current limit corresponds to the static charge power limit of the battery pack, and may be determined based on the correspondence.

Specifically, the charge current limit in this embodiment of this application may be calculated based on the following formula:

$$P'_{static}=I'_{total\ threshold} \times U'_{actual}$$

where, $P'_{static}$ is the static charge power limit of the battery pack; $I'_{total\ threshold}$ is the charge current limit of the battery pack; and $U'_{actual}$ is an actual voltage of the battery pack, and may be calculated based on a preset relationship or may be determined by querying a preset relationship table of the static charge power limit, the charge current limit, and the voltage. The electrical cores in the battery pack are serial-connected with each other. Therefore, the actual voltage of the battery pack is a sum of actual voltages of all the electrical cores; and the charge current limit of the battery pack is the same as the charge current limit of the electrical cores.

S2303: Determining the estimated charge voltage of the electrical core with the maximum voltage based on the actual maximum cell voltage of the electrical core with the maximum voltage, the actual charge current of the electrical core with the maximum voltage, the charge current limit of the battery pack, and the charge-state internal resistance of the electrical core with the maximum voltage.

In this embodiment of this application, the estimated charge voltage is determined by using the following formula:

$$V'_{estimated}=V'_{actual}+(I'_{actual}-I'_{threshold}) \times DCR'$$

where, $V'_{estimated}$ is the estimated charge voltage of the electrical core with the maximum voltage; $V'_{actual}$ is the actual maximum cell voltage of the electrical core with the maximum voltage; $I'_{actual}$ is the actual charge current of the electrical core with the maximum voltage; $I'_{threshold}$ is the charge current limit of the electrical core with the maximum voltage; and DCR' is the charge-state internal resistance of the electrical core with the maximum voltage.

In this embodiment of this application, in a regenerative braking scenario during operation of the vehicle, the battery pack keeps being in a charge state during regenerative braking, and the estimated charge voltage of the electrical core with the maximum voltage in the battery pack may be determined by using the foregoing formula. When the regenerative braking of the vehicle just begins, the actual maximum cell voltage is a cell open circuit voltage (OCV') of the electrical core with the maximum voltage in the battery pack. The actual maximum cell voltage may be obtained by querying a correspondence table of the SOC, the temperature, and the open circuit voltage. When the regenerative braking of the vehicle just begins, no actual charge current is generated, so that $I'_{actual}$ is 0. Therefore, the formula for calculating the estimated charge voltage of the electrical core with the maximum voltage is transformed into:

$$V'_{estimated}=OCV'+I'_{threshold} \times DCR'$$

where, OCV' is the cell open circuit voltage of the electrical core with the maximum voltage in the battery pack, $I'_{threshold}$ is the charge current limit of the electrical core with the maximum voltage, and DCR' is the charge-state internal resistance of the electrical core with the maximum voltage.

The estimated voltage of the electrical core with the maximum voltage is calculated in the way described above, so that the estimated voltage is closer to a voltage range available to the electrical core with the maximum voltage in the battery pack at a next moment. In this way, the subsequent calculation of the charge power limit is more accurate and reasonable.

S240: Determining whether the estimated charge voltage falls between a charge voltage control threshold of the electrical core with the maximum voltage and an overvoltage threshold of the electrical core with the maximum voltage, where the charge voltage control threshold is less than the overvoltage threshold.

In this embodiment of this application, a charge voltage control threshold of the electrical core with the maximum voltage is set. To be specific, the charge power limit is calculated when the estimated charge voltage of the electrical core with the maximum voltage is greater than the charge voltage control threshold and less than the overvoltage threshold.

This makes regenerative charging overvoltage less likely to occur when the cell voltage of the electrical core with the maximum voltage in the battery pack is relatively low. When the cell voltage of the electrical core with the maximum voltage in the battery pack increases during charging, the probability of overvoltage increases. Therefore, when the maximum cell voltage of the electrical core with the maximum voltage in the battery pack is relatively low, the target charge power limit may be determined by existing means of table query or by other means. When the cell voltage of the electrical core with the maximum voltage in the battery pack increases to a value that is greater than the charge voltage control threshold, the target charge power limit is determined by using the method for estimating a power limit of a battery pack according to this embodiment of this application, so that the determined target charge power limit is more reasonable and accurate. Therefore, in this embodiment of this application, the charge voltage control threshold of the electrical core with the maximum voltage is set as a trigger condition of control. The value of the charge voltage control threshold is not specifically limited in this embodiment of this application, and may be set by a person skilled in the art based on a specific application scenario and parameters of the battery pack. The overvoltage threshold in this embodiment of this application may be the real overvoltage threshold of the battery pack, or may be slightly higher than the real overvoltage threshold. In an embodiment of this application, the charge voltage control threshold may be a cell open circuit voltage of the electrical core with the maximum voltage at a 100 SOC (that is, when the state of charge value is 100%). Specifically, the static cell open circuit voltage at a 100 SOC may be determined based on the temperature of the electrical core with the maximum voltage. If the static cell open circuit voltage of the electrical core with the maximum voltage at a 100 SOC is 4.2 V, the charge voltage control threshold is about 4.2 V, which is about 200 mV lower than the real overvoltage threshold of the electrical core with the maximum voltage.

S250: Determining a target charge power limit of the battery pack through a charge interpolation algorithm based on the estimated charge voltage of the electrical core with the maximum voltage, the static charge power limit of the battery pack, the charge voltage control threshold of the electrical core with the maximum voltage, the overvoltage threshold of the electrical core with the maximum voltage, and a minimum power limit of an integrated vehicle when the estimated charge voltage falls between the charge voltage control threshold of the electrical core with the maximum voltage and the overvoltage threshold of the electrical core with the maximum voltage.

All the electrical cores in the battery pack are serial-connected, and the charge current of the electrical cores in the battery pack depends on the voltage of the electrical core with the maximum voltage. Therefore, the target charge power limit of the battery pack is limited by the electrical core with the maximum voltage. Therefore, based on a proportional relationship between the estimated voltage, the overvoltage threshold, and the charge voltage control threshold of the electrical core with the maximum voltage, a proportional relationship between the target charge power limit, the static charge power limit, and the minimum power limit of an integrated vehicle can be determined, and the target charge power limit is thereby determined.

In this embodiment of this application, the target charge power limit of the battery pack may be determined by using the following charge interpolation algorithm:

$$P'_{max} = \frac{(P'_{static} - P'_{min})}{V'_{tg100} - V'_{tg0}} \times (V'_{estimated} - V'_{tg0}) + P'_{min}.$$

The charge interpolation algorithm is a linear interpolation algorithm. where, $P'_{max}$ represents the target charge power limit of the battery pack; $P'_{static}$ represents the static charge power limit of the battery pack; $P'_{min}$ represents the minimum power limit of an integrated vehicle; $V'_{tg100}$ is the charge voltage control threshold of the electrical core with the maximum voltage; $V'_{tg0}$ is the overvoltage threshold of the electrical core with the maximum voltage; and $V'_{estimated}$ represents the estimated charge voltage of the electrical core with the maximum voltage.

In another embodiment of this application, the "determining a target charge power limit of the battery pack through a charge interpolation algorithm based on the estimated charge voltage of the electrical core with the maximum voltage, the static charge power limit of the battery pack, the charge voltage control threshold of the electrical core with the maximum voltage, the overvoltage threshold of the electrical core with the maximum voltage, and a minimum power limit of an integrated vehicle" includes the following steps.

S2501: Using a difference between the estimated charge voltage of the electrical core with the maximum voltage and the overvoltage threshold of the electrical core with the maximum voltage as an input error term of a PID algorithm to obtain a charge correction term.

The charge correction term is determined by using the following formula:

$$\Delta V'_{corrected} = k'_p \times (V'_{estimated} - V'_{tg0}) + k'_i \times \text{integral term}$$
$$\text{of } (V'_{estimated} - V'_{tg0}) + k'_d \times \text{variation}$$
$$\text{of } (V'_{estimated} - V'_{tg0}).$$

The PID algorithm works in the following way: in process control, the PID algorithm continuously calculates an error value and applies a correction based on proportional (P), integral (I), and derivative (D) terms, so that a measured process variable is input, and a control variable is output. The output control variable exerts an influence on the input process variable, so that the process variable can be close to a target value. Generally, an object under control is inertial rather than instantaneous. PID includes three terms: a proportional term ($k'_p \times$ error), an integral term ($k'_i \times$ a sum of errors over a past period), and a derivative term ($k'_d \times$ a rate of error change). The error means a difference between the measured process variable and the target value. In this embodiment of this application, the charge correction term is calculated based on the estimated charge voltage and the overvoltage threshold, and is a correction term for correcting ($V'_{estimated} - V'_{tg0}$) in the interpolation formula.

S2502: Correcting the charge interpolation algorithm based on the charge correction term.

In this embodiment of this application, the charge interpolation algorithm is corrected based on the charge correction term, and the corrected interpolation algorithm is:

$$P'_{max} = \frac{(P'_{static} - P'_{min})}{V'_{tg100} - V'_{tg0}} \times \Delta V'_{corrected} + P'_{min}$$

where, with respect to the variables $k'_p$, $k'_i$, and $k'_d$ in $\Delta V'_{corrected}$, $k'_p$ is not 0, and $k'_i$ and $k'_d$ may be 0. To be specific, depending on the specific scenario, $k'_p$ alone may be selected as the variable, or $k'_p$, $k'_i$, and $k'_d$ are all selected as variables. When $k'_p$ is 1, and $k'_i$ and $k'_d$ are both 0, the interpolation algorithm is not corrected. In this embodiment of this application, specific values of $k'_p$, $k'_i$, and $k'_d$ may be obtained by calibrating and training based on the specific scenario. Specifically, based on a correspondence between the estimated charge voltage of the electrical core with the maximum voltage and a target power limit of the battery pack in a preset scenario, the specific values may be obtained by calibrating based on the corrected interpolation algorithm.

S2503: Calculating a target charge power limit of the battery pack through the corrected charge interpolation algorithm based on the estimated charge voltage of the electrical core with the maximum voltage, the static charge power limit of the battery pack, the charge voltage control threshold of the electrical core with the maximum voltage, the overvoltage threshold of the electrical core with the maximum voltage, and a minimum power limit of an integrated vehicle.

In this embodiment of this application, the interpolation algorithm is corrected, so that the calculated target charge power limit is more accurate and reasonable, and the voltage can be controlled soundly to avoid overvoltage.

In this embodiment of this application, after the target charge power limit is obtained, the method further includes the following steps.

S260: Outputting the target charge power limit to a controller of a vehicle to control the charge power during operation of the vehicle.

The controller of the vehicle may be a vehicle control unit (VCU) or an electronic control unit (ECU). Based on the target charge power limit, the controller of the vehicle controls the charge power during regenerative braking, so that the voltage can be well controlled in the control process to avoid overvoltage. In addition, the charge power changes smoothly or even remains steady.

In the method for estimating a power limit of a battery pack according to this embodiment of this application, the estimated charge voltage of the electrical core with the maximum voltage is calculated. The estimated charge voltage of the electrical core with the maximum voltage is closer to a voltage range available to the electrical core with the maximum voltage in the battery pack at a next moment, so that the estimation of the target charge power limit is more accurate. In addition, in this embodiment of this application, when the estimated charge voltage of the electrical core with the maximum voltage falls within a preset threshold range, the target power limit within the preset threshold range is calculated through an interpolation algorithm. Therefore, the power limit can be estimated accurately and reasonably, the vehicle can control the voltage soundly to avoid overvoltage, and the change of the charge power is smooth in a process of controlling the vehicle.

Figure 3:
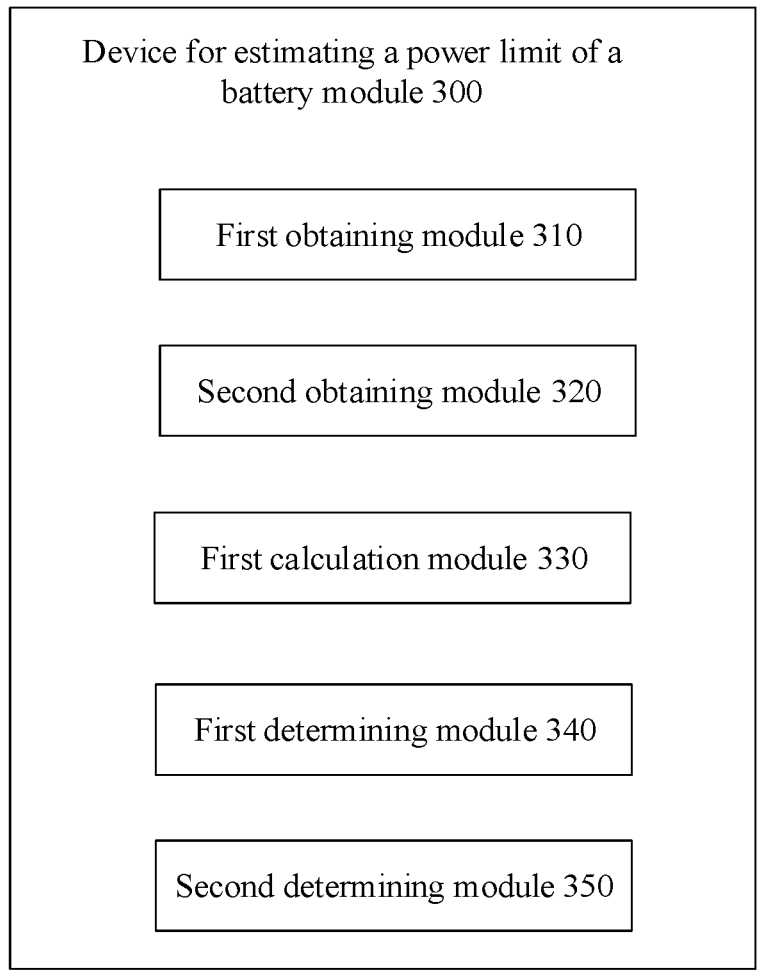
FIG. 3 shows a schematic structural diagram of a device for estimating a power limit of a battery pack according to an embodiment of this application.

FIG. 3 shows a schematic structural diagram of a device for estimating a power limit of a battery pack according to an embodiment of this application. As shown in FIG. 3, the device 300 includes: a first obtaining module 310, a second obtaining module 320, a first calculation module 330, a first determining module 340, and a second determining module 350.

The first obtaining module 310 is configured to obtain an actual minimum cell voltage of an electrical core with a minimum voltage in the battery pack.

The second obtaining module 320 is configured to obtain a static discharge power limit of the battery pack.

The first calculation module 330 is configured to calculate, based on the actual minimum cell voltage, an estimated discharge voltage of the electrical core with the minimum voltage for use when the battery pack is discharged based on the static discharge power limit.

The first determining module 340 is configured to determine whether the estimated discharge voltage falls between a discharge voltage control threshold of the electrical core with the minimum voltage and an undervoltage threshold of the electrical core with the minimum voltage, where the discharge voltage control threshold is greater than the undervoltage threshold.

The second determining module 350 is configured to determine a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage of the electrical core with the minimum voltage falls between the discharge voltage control threshold of the electrical core with the minimum voltage and the undervoltage threshold.

In this embodiment of this application, the device further includes a first output module. The first output module is configured to output the target discharge power limit to a controller of a vehicle to control the discharge power during operation of the vehicle.

The specific working process of the device for estimating a power limit of a battery pack according to this embodiment of this application is consistent with the specific steps of the method for estimating a power limit of a battery pack according to the foregoing embodiment, and is omitted here.

In the device for estimating a power limit of a battery pack according to this embodiment of this application, the estimated discharge voltage of the electrical core with the minimum voltage is calculated. The estimated discharge voltage is closer to a voltage range available to the electrical core with the minimum voltage in the battery pack at a next moment, so that the estimation of the target discharge power limit is more accurate. In addition, in this embodiment of this application, when the estimated discharge voltage falls within a preset threshold range, the target discharge power limit within the preset threshold range is calculated through an interpolation algorithm. Therefore, the power limit can be estimated accurately and reasonably, the vehicle can control the voltage soundly to avoid undervoltage, and the change of the discharge power is smooth in a process of controlling the vehicle.

Figure 4:
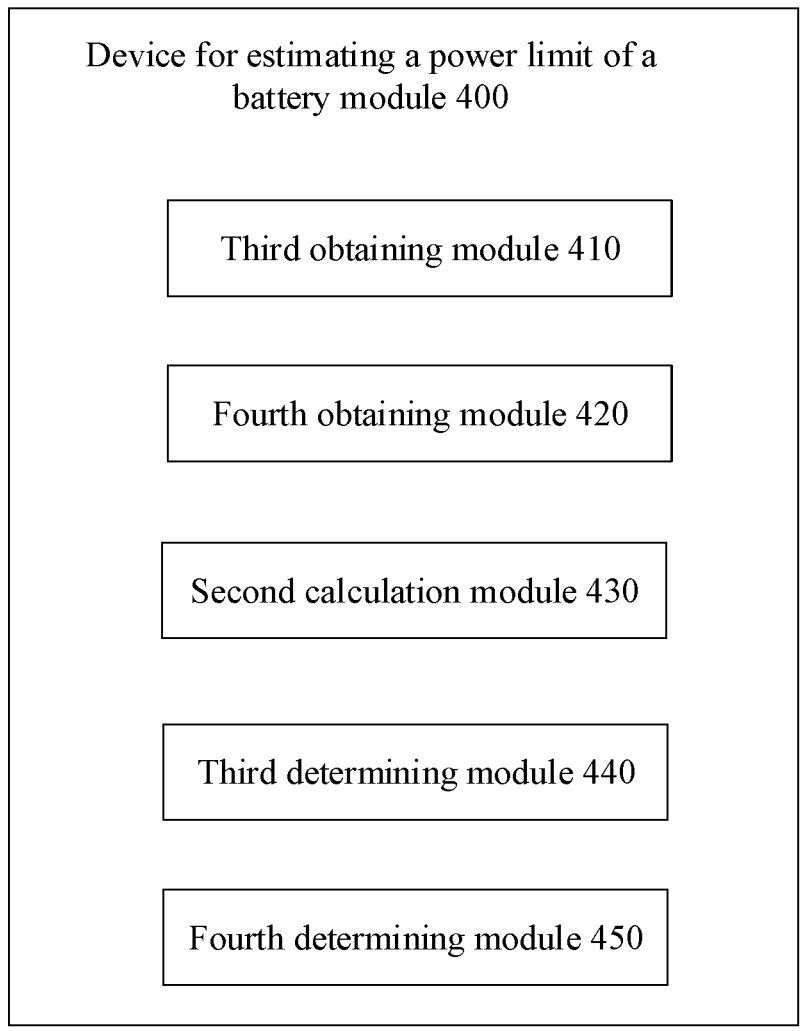
FIG. 4 shows a schematic structural diagram of a device for estimating a power limit of a battery pack according to another embodiment of this application.

FIG. 4 shows a schematic structural diagram of a device for estimating a power limit of a battery pack according to an embodiment of this application. As shown in FIG. 4, the device 400 includes: a third obtaining module 410, a fourth obtaining module 420, a second calculation module 430, a third determining module 440, and a fourth determining module 450. Specifically, the modules are described below.

The third obtaining module 410 is configured to obtain an actual maximum cell voltage of an electrical core with a maximum voltage in the battery pack.

The fourth obtaining module 420 is configured to obtain a static charge power limit of the battery pack.

The second calculation module 430 is configured to calculate, based on the actual maximum cell voltage, an estimated charge voltage of the electrical core with the maximum voltage for use when the battery pack is charged based on the static charge power limit.

The third determining module 440 is configured to determine whether the estimated charge voltage falls between a charge voltage control threshold of the electrical core with the maximum voltage and an overvoltage threshold, where the charge voltage control threshold is less than the overvoltage threshold.

The fourth determining module 450 is configured to determine a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold.

In an embodiment of this application, the device further includes a second output module. The second output module is configured to output the target charge power limit to a controller of a vehicle to control the charge power during operation of the vehicle.

The specific working process of the device for estimating a power limit of a battery pack according to this embodiment of this application is consistent with the specific steps of the method for estimating a power limit of a battery pack according to the foregoing embodiment, and is omitted here.

In the method for estimating a power limit of a battery pack according to this embodiment of this application, the estimated charge voltage of the electrical core with the maximum voltage is calculated. The estimated charge voltage is closer to a voltage range available to the electrical core with the maximum voltage in the battery pack at a next moment, so that the estimation of the target charge power limit is more accurate. In addition, in this embodiment of this application, when the estimated charge voltage falls within a preset threshold range, the target charge power limit within the preset threshold range is calculated through an interpolation algorithm. Therefore, the charge power limit can be estimated accurately and reasonably, the vehicle can control the voltage soundly to avoid overvoltage, and the change of the charge power is smooth in a process of controlling the vehicle.

Figure 5:
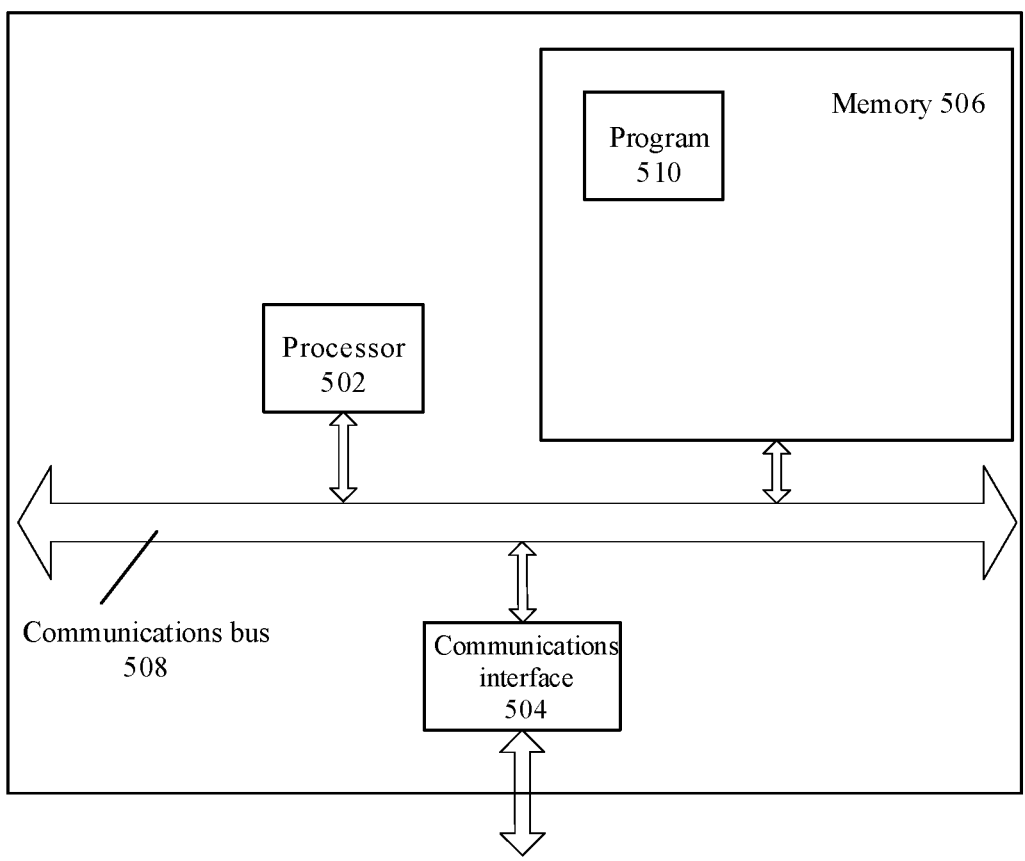
FIG. 5 shows a schematic structural diagram of a battery management system according to an embodiment of this application.

FIG. 5 shows a schematic structural diagram of a battery management system according to an embodiment of this application. The specific implementation of the battery management system is not limited in a specific embodiment of this application.

As shown in FIG. 5, the battery management system may include: a processor 502, a communications interface 504, a memory 506, and a communications bus 508.

The processor 502, the communications interface 504, and the memory 506 communicate with each other through the communications bus 508. The communications interface 504 is configured to communicate with other devices and network elements such as a client or a server. The processor 502 is configured to execute a program 510, and specifically, may perform relevant steps in the embodiment of the method for estimating a power limit of a battery pack, so as to control the discharge power or the charge power during operation of the vehicle.

Specifically, the program 510 may include program code. The program code includes a computer-executable instruction.

The processor 502 may be a central processing unit (CPU), or an application-specific integrated circuit (ASIC), or one or more integrated circuits configured to implement an embodiment of this application. One or more processors included in the battery management system may be the same type of processor, such as one or more CPUs, or different types of processors, such as one or more CPUs and one or more ASICs.

The memory 506 is configured to store a program 510. The memory 506 may include a high-speed RAM memory, and may further include a non-volatile memory such as at least one disk memory.

Specifically, the program 510 may be invoked by the processor 502 to cause the battery management system to perform the following operations:

obtaining an actual minimum cell voltage of an electrical core with a minimum voltage in a battery pack;

obtaining a static discharge power limit of the battery pack;

calculating, based on the actual minimum cell voltage, an estimated discharge voltage of the electrical core with the minimum voltage for use when the battery pack is discharged based on the static discharge power limit;

determining whether the estimated discharge voltage falls between a discharge voltage control threshold of the electrical core with the minimum voltage and an undervoltage threshold of the electrical core with the minimum voltage, where the discharge voltage control threshold is greater than the undervoltage threshold; and determining a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage. Alternatively, the program 510 may be invoked by the processor 502 to cause the battery management system to perform the following operations:

obtaining an actual maximum cell voltage of an electrical core with a maximum voltage in the battery pack;

obtaining a static charge power limit of the battery pack;

calculating, based on the actual maximum cell voltage, an estimated charge voltage of the electrical core with the maximum voltage for use when the battery pack is charged based on the static charge power limit;

determining whether the estimated charge voltage falls between a charge voltage control threshold of the electrical core with the maximum voltage and an overvoltage threshold of the electrical core with the maximum voltage, where the charge voltage control threshold is less than the overvoltage threshold; and determining a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage.

The process of estimating the power limit by the battery management system according to this embodiment of this application is consistent with the specific steps of the method for estimating a power limit of a battery pack according to the foregoing embodiment, and is omitted here.

The battery management system according to this embodiment of this application can calculate the estimated voltage. The estimated voltage is closer to a real voltage value of the battery pack, so that the estimation of the target power limit is more accurate. In addition, when the estimated voltage falls within a preset threshold range, the target power limit within the preset threshold range is calculated through an interpolation algorithm. Therefore, the power limit can be estimated accurately and reasonably, the vehicle can control the voltage soundly to avoid undervoltage, and the change of the power is smooth in a process of controlling the vehicle.

An embodiment of this application further provides a powered vehicle. The powered vehicle includes the battery management system according to the foregoing embodiment. The battery management system is configured to perform the estimation of a power limit of a battery pack according to the foregoing embodiment. The process of estimating the power limit by the battery management system of the powered vehicle is consistent with the specific steps of the method for estimating a power limit of a battery pack according to the foregoing embodiment, and is omitted here.

The powered vehicle according to this embodiment of this application can calculate the estimated voltage. The estimated voltage is closer to a real voltage value of the battery pack, so that the estimation of the target power limit is more accurate. In addition, when the estimated voltage falls within a preset threshold range, the target power limit within the preset threshold range is calculated through an interpolation algorithm. Therefore, the power limit can be estimated accurately and reasonably, the vehicle can control the voltage soundly to avoid undervoltage, and the change of the power is smooth in a process of controlling the vehicle.

An embodiment of this application provides a computer-readable storage medium. The storage medium stores at least one executable instruction. When being executed on a device for estimating a power limit of a battery pack, the executable instruction causes a device for estimating a power limit of a battery pack to perform the method for estimating a power limit of a battery pack according to any of the foregoing method embodiments.

Specifically, the executable instruction may be configured to cause the device for estimating a power limit of a battery pack to perform the following operations:

obtaining an actual minimum cell voltage of an electrical core with a minimum voltage in a battery pack;

obtaining a static discharge power limit of the battery pack;

calculating, based on the actual minimum cell voltage, an estimated discharge voltage of the electrical core with the minimum voltage for use when the battery pack is discharged based on the static discharge power limit;

determining whether the estimated discharge voltage falls between a discharge voltage control threshold of the electrical core with the minimum voltage and an undervoltage threshold of the electrical core with the minimum voltage, where the discharge voltage control threshold is greater than the undervoltage threshold; and determining a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage. Alternatively, the executable instruction may be configured to cause the device for estimating a power limit of a battery pack to perform the following operations:

obtaining an actual maximum cell voltage of an electrical core with a maximum voltage in the battery pack;

obtaining a static charge power limit of the battery pack;

calculating, based on the actual maximum cell voltage, an estimated charge voltage of the electrical core with the maximum voltage for use when the battery pack is charged based on the static charge power limit;

determining whether the estimated charge voltage falls between a charge voltage control threshold of the electrical core with the maximum voltage and an overvoltage threshold of the electrical core with the maximum voltage, where the charge voltage control threshold is less than the overvoltage threshold; and determining a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage.

An embodiment of this application provides a device for estimating a power limit of a battery pack. The device is configured to perform the foregoing method for estimating a power limit of a battery pack.

An embodiment of this application provides a computer program. The computer program can be invoked by a processor to cause the device for estimating a power limit of a battery pack to perform the method for estimating a power limit of a battery pack according to any of the foregoing method embodiments.

An embodiment of this application provides a computer program product. The computer program product includes a computer program stored in a computer-readable storage medium. The computer program includes a program instruction. When being executed on a computer, the program instruction causes the computer to perform the method for estimating a power limit of a battery pack according to any of the foregoing method embodiments.

The algorithms and displays presented herein are not inherently related to any particular computer, virtual system or other devices. Various general-purpose systems may be used with programs in accordance with the teachings herein. The required structure for constructing a variety of such systems is evident in the foregoing description. In addition, the embodiments of this application are not described with reference to any particular programming language. Understandably, a variety of programming languages may be used to implement the teachings of this application as described herein. The description on a specific language above is intended to disclose a first-choice implementation of this application.

In the specification provided herein, a lot of specific details are explained. However, it can be understood that the embodiments of this application can be practiced without the specific details. In some instances, well-known methods, structures, and technologies are not shown in detail, so as not to obscure this specification.

Similarly, it is understandable that, in order to simplify this application and help understand one or more of the various invention aspects, in the foregoing description of the exemplary embodiments of this application, various features of the embodiments of this application are sometimes grouped together into a single embodiment, drawing, or description thereof. However, the disclosed method is never to be interpreted as reflecting the intention that this application seeks to protect more features than the features explicitly set forth in each claim.

A person skilled in the art understands that the modules in the device in an embodiment hereof may be adaptively changed and disposed in one or more devices different from the device described in such embodiment. The modules or units or components in an embodiment may be combined into one module or unit or component, or each may be divided into a plurality of submodules or subunits or subcomponents. All of the features disclosed in this specification (including any accompanying claims, abstract, and drawings), and all of the processes or units of any method or device so disclosed, may be combined in any combination, except combinations where at least some of such features and/or processes or units are mutually exclusive. Each feature disclosed in this specification (including any accompanying claims, abstract, and drawings) may be replaced by an alternative feature serving the same, equivalent or similar purpose, unless otherwise expressly stated.

It needs to be noted that the foregoing embodiments are intended to describe this application but not to limit this application, and a person skilled in the art can work out an alternative embodiment without departing from the scope of the claims appended hereto. In the claims, no reference numeral embraced in parentheses constitutes a limitation on the claims. The words "comprise" and "contain" do not exclude the presence of elements or steps not enumerated in the claims. The word "a" or "an" preceding a component does not exclude the presence of a plurality of such components. This application may be implemented by means of hardware that contains several different components and by means of an appropriately programmed computer. In a unit claim in which several devices are enumerated, several of the devices may be embodied by the same hardware item. The words such as "first", "second", and "third" do not indicate any order. Such words may be just interpreted as names. Unless otherwise specified, the steps in the foregoing embodiments are never to be understood as a limitation on the order of implementation.

What is claimed is:

1. A method for estimating a power limit of a battery pack, comprising:
    obtaining an actual minimum cell voltage of an electrical core with a minimum voltage in the battery pack;
    obtaining a static discharge power limit of the battery pack;
    calculating, based on the actual minimum cell voltage, an estimated discharge voltage of the electrical core with the minimum voltage for use when the battery pack is discharged based on the static discharge power limit;
    determining whether the estimated discharge voltage falls between a discharge voltage control threshold of the electrical core with the minimum voltage and an undervoltage threshold of the electrical core with the minimum voltage, wherein the discharge voltage control threshold is greater than the undervoltage threshold; and
    determining a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage.

2. The method according to claim 1, wherein the obtaining a static discharge power limit of the battery pack comprises:
    obtaining a minimum state of charge value of electrical cores in the battery pack;
    obtaining a first temperature of the battery pack; and
    querying, based on the minimum state of charge value and the first temperature of the battery pack, a preset first correspondence table of a state of charge, a temperature, and a discharge power to obtain the static discharge power limit.

3. The method according to claim 1, wherein the calculating, based on the actual minimum cell voltage, an estimated discharge voltage of the electrical core with the minimum voltage for use when the battery pack is discharged based on the static discharge power limit comprises:
    obtaining the actual minimum cell voltage of the electrical core with the minimum voltage in the battery pack, an actual discharge current of the electrical core with the minimum voltage, and a corresponding discharge-state internal resistance of the electrical core with the minimum voltage;
    determining a discharge current limit of the battery pack based on the static discharge power limit; and
    determining the estimated discharge voltage of the electrical core with the minimum voltage based on the actual minimum cell voltage of the electrical core with the minimum voltage, the actual discharge current of the electrical core with the minimum voltage, the discharge current limit of the battery pack, and the discharge-state internal resistance of the electrical core with the minimum voltage.

4. The method according to claim 1, wherein the "determining a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage" comprises:
    using a difference between the estimated discharge voltage and the undervoltage threshold of the electrical core with the minimum voltage as an input error term of a proportional-integral-derivative (PID) algorithm to obtain a discharge correction term;
    correcting the discharge interpolation algorithm based on the discharge correction term; and
    calculating the target discharge power limit of the battery pack through the corrected discharge interpolation algorithm based on the estimated discharge voltage, the static discharge power limit, the discharge voltage control threshold, the undervoltage threshold, and the minimum power limit of an integrated vehicle.

5. The method according to claim 4, wherein the corrected discharge interpolation algorithm is:

$$P_{max} = \frac{(P_{static} - P_{min})}{V_{tg100} - V_{tg0}} \times \Delta V_{corrected} + P_{min}$$

wherein, $P_{max}$ represents the target discharge power limit of the battery pack; $P_{static}$ represents the static discharge power limit of the battery pack; $P_{min}$ represents the minimum power limit of an integrated vehicle; $V_{tg100}$ is the discharge voltage control threshold of the electrical core with the minimum voltage; $V_{tg0}$ is the undervoltage threshold of the electrical core with the minimum voltage; and $\Delta V_{corrected}$ represents the discharge correction term calculated based on the estimated discharge voltage and the undervoltage threshold.

6. A method for estimating a power limit of a battery pack, comprising:
    obtaining an actual maximum cell voltage of an electrical core with a maximum voltage in the battery pack;
    obtaining a static charge power limit of the battery pack;
    calculating, based on the actual maximum cell voltage, an estimated charge voltage of the electrical core with the maximum voltage for use when the battery pack is charged based on the static charge power limit;
    determining whether the estimated charge voltage falls between a charge voltage control threshold of the electrical core with the maximum voltage and an overvoltage threshold of the electrical core with the maximum voltage, wherein the charge voltage control threshold is less than the overvoltage threshold; and
    determining a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage.

7. The method according to claim 6, wherein the obtaining a static charge power limit of the battery pack comprises:
    obtaining a maximum state of charge value of electrical cores in the battery pack and a second temperature of the battery pack; and
    querying, based on the maximum state of charge value and the second temperature of the battery pack, a preset second correspondence table of a state of charge, a temperature, and a charge power to obtain the static charge power limit.

8. The method according to claim 6, wherein the calculating, based on the actual maximum cell voltage, an estimated charge voltage of the electrical core with the maximum voltage for use when the battery pack is charged based on the static charge power limit comprises:
    obtaining the actual maximum cell voltage of electrical cores in the battery pack, an actual charge current of the electrical core with the maximum voltage, and a corresponding charge-state internal resistance of the electrical core with the maximum voltage;
    determining a charge current limit of the battery pack based on the static charge power limit of the battery pack; and
    determining the estimated charge voltage based on the actual maximum cell voltage, the actual charge current, the charge current limit, and the charge-state internal resistance.

9. The method according to claim 6, wherein the "determining a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage" comprises:
    using a difference between the estimated charge voltage and the overvoltage threshold of the electrical core with the maximum voltage as an input error term of a PID algorithm to obtain a charge correction term;
    correcting the charge interpolation algorithm based on the charge correction term; and
    calculating the target charge power limit of the battery pack through the corrected charge interpolation algorithm based on the estimated charge voltage, the static charge power limit, the charge voltage control threshold, the overvoltage threshold, and the minimum power limit of an integrated vehicle.

10. The method according to claim 9, wherein the corrected charge interpolation algorithm is:

$$P'_{max} = \frac{(P'_{static} - P'_{min})}{V'_{tg100} - V'_{tg0}} \times \Delta V'_{corrected} + P'_{min}$$

wherein, $P'_{max}$ represents the target charge power limit of the battery pack; $P'_{static}$ represents the static charge power limit of the battery pack; $P'_{min}$ represents the minimum power limit of an integrated vehicle; $V'_{tg100}$ is the charge voltage control threshold of the electrical core with the maximum voltage; $V'_{tg0}$ is the overvoltage threshold of the electrical core with the maximum voltage; and $\Delta V'_{corrected}$ represents the charge correction term calculated based on the estimated charge voltage and the overvoltage threshold.

11. A device for estimating a power limit of a battery pack, comprising a processor and a memory storing a plurality of modules to be executed by the processor, the plurality of modules further including:
    a first obtaining module, configured to obtain an actual minimum cell voltage of an electrical core with a minimum voltage in the battery pack;
    a second obtaining module, configured to obtain a static discharge power limit of the battery pack;
    a first calculation module, configured to calculate, based on the actual minimum cell voltage, an estimated discharge voltage of the electrical core with the minimum voltage for use when the battery pack is discharged based on the static discharge power limit;
    a first determining module, configured to determine whether the estimated discharge voltage falls between a discharge voltage control threshold of the electrical core with the minimum voltage and an undervoltage threshold of the electrical core with the minimum voltage, wherein the discharge voltage control threshold is greater than the undervoltage threshold; and
    a second determining module, configured to determine a target discharge power limit of the battery pack through a discharge interpolation algorithm based on the estimated discharge voltage, the static discharge power limit, the discharge voltage control threshold, the undervoltage threshold, and a minimum power limit of an integrated vehicle when the estimated discharge voltage falls between the discharge voltage control threshold of the electrical core with the minimum voltage and the undervoltage threshold of the electrical core with the minimum voltage.

12. A device for estimating a power limit of a battery pack, comprising a processor and a memory storing a plurality of modules to be executed by the processor, the plurality of modules further including:
    a third obtaining module, configured to obtain an actual maximum cell voltage of an electrical core with a maximum voltage in the battery pack;
    a fourth obtaining module, configured to obtain a static charge power limit of the battery pack;
    a second calculation module, configured to calculate, based on the actual maximum cell voltage, an estimated charge voltage of the electrical core with the maximum voltage for use when the battery pack is charged based on the static charge power limit;
    a third determining module, configured to determine whether the estimated charge voltage falls between a charge voltage control threshold of the electrical core with the maximum voltage and an overvoltage threshold of the electrical core with the maximum voltage, wherein the charge voltage control threshold is less than the overvoltage threshold; and
    a fourth determining module, configured to determine a target charge power limit of the battery pack through a charge interpolation algorithm based on the estimated charge voltage, the static charge power limit, the charge voltage control threshold, the overvoltage threshold, and a minimum power limit of an integrated vehicle when the estimated charge voltage falls between the charge voltage control threshold of the electrical core with the maximum voltage and the overvoltage threshold of the electrical core with the maximum voltage.

13. A battery management system, comprising: a processor, a memory, a communications interface, and a communications bus; and the processor, the memory, and the communications interface communicate with each other through the communications bus; and the memory stores at least one executable instruction, and the executable instruction causes the processor to perform operations of the method for estimating the power limit of the battery pack according to claim 1.

14. A powered vehicle, wherein the powered vehicle comprises the battery management system according to claim 13.

15. A non-transitory computer-readable storage medium storing at least one executable instruction that, when being executed on a device, causes the device to perform operations of the method for estimating the power limit of the battery pack according to claim 1.

\* \* \* \* \*